United States Patent [19]

Sunami et al.

[11] Patent Number: 5,017,981
[45] Date of Patent: May 21, 1991

[54] SEMICONDUCTOR MEMORY AND METHOD FOR FABRICATING THE SAME

[75] Inventors: Hideo Sunami, Tokyo; Tokuo Kure, Kokubunji; Yoshifumi Kawamoto, Kanagawa, all of Japan

[73] Assignee: Hitachi, Ltd., Tokyo, Japan

[21] Appl. No.: 204,736

[22] Filed: Jun. 10, 1988

Related U.S. Application Data

[60] Division of Ser. No. 93,160, Sep. 1, 1987, abandoned, which is a continuation of Ser. No. 465,341, Feb. 9, 1983, abandoned.

[30] Foreign Application Priority Data

Feb. 10, 1982 [JP] Japan .................................. 57-18740

[51] Int. Cl.$^5$ .................... H01L 29/68; H01L 29/78; H01L 29/92
[52] U.S. Cl. ........................................ 357/23.6; 357/51
[58] Field of Search .................... 357/23.6, 23.6 G, 51

[56] References Cited

U.S. PATENT DOCUMENTS

| | | | |
|---|---|---|---|
| 3,811,076 | 5/1974 | Smith, Jr. ............................ | 357/23.6 |
| 4,017,885 | 4/1977 | Kendall et al. ....................... | 357/23.6 |
| 4,151,607 | 4/1979 | Koyanagi et al. .................... | 357/23.6 |
| 4,164,751 | 8/1979 | Tasch, Jr. ............................ | 357/41 |
| 4,199,772 | 4/1980 | Natori et al. ........................ | 357/41 X |
| 4,511,911 | 4/1985 | Kenney ................................ | 357/23.6 |
| 4,621,277 | 11/1986 | Ito et al. ............................. | 357/52 X |

OTHER PUBLICATIONS

Sze, S. M., *Physics of Semiconductor Devices*, 2nd Ed., John Wiley, 1981, pp. 496–497.

*Primary Examiner*—Andrew J. James
*Assistant Examiner*—Sara W. Crane
*Attorney, Agent, or Firm*—Antonelli, Terry, Stout & Kraus

[57] ABSTRACT

A semiconductor memory is provided having a capacitor formed by utilizing a groove formed in a semiconductor substrate and an insulated gate field effect transistor. In particular, an arrangement is provided to prevent a depletion region formed around the groove from growing into an adjacent capacitor. By virtue of this, both the area occupied by each memory cell and the distance between the memory cells can be made very small. Accordingly, high density integration is facilitated.

11 Claims, 9 Drawing Sheets

SEMICONDUCTOR MEMORY AND METHOD FOR FABRICATING THE SAME

This is a divisional of application Ser. No. 093,160, filed Sept. 1, 1987, now abandoned which is a continuation application of Ser. No. 465,341, filed Feb. 9, 1983, now abandoned.

The present invention relates to a semiconductor memory and a method for fabricating the same, and more particularly to a semiconductor memory and a method for fabricating the same, which can increase a memory capacity without increasing the amount of required for forming of the memory space.

Since a 1k-bit dynamic random access memory (hereinafter referred to as a dRAM) was first marketed at the beginning of 1970, a MOS dynamic memories which is one of the types of semiconductor IC memories have been scaled up four times in memory capacity in every approximately every three years. A package for accommodating the memory chip primarily uses a 16-pin dual in-line package (DIP) and a cavity size for accommodating the chip is limited. Thus, the size of the memory chip has been increased only about 1.4 times while the integration density has increased four times. Accordingly, a memory cell area per bit has been significantly reduced as the integration density has been increased. Specifically the memory cell are a per bit has been reduced by a factor of three for the increase of the integration density by a factor of four.

Since a capacitance C of the semiconductor memory is represented by $C = \epsilon A/t$ (where $\epsilon$ is a dielectric constant of an insulation film, A is an area of a capacitor electrode and t is a thickness of the insulation film between the capacitor electrodes), if the area A is reduced by a factor of three, the capacitance C is also reduced by a factor of three provided that $\epsilon$ and t are kept constant. A signal quantity S derived from a memory capacitor is proportional to a charge quantity Q which is the product of the capacitance C and a voltage V. Thus, if A is reduced, Q is reduced proportionally and the signal quantity S is also reduced accordingly.

A signal to noise ratio S/N decreases as S decreases. This will raise a big problem in circuit operation. Accordingly, the decrease of A is usually compensated by the decrease of t. Thus, as the integration density is increased to 4 kb, 16 kb and 64 kb, a thickness of a typical $SiO_2$ film is reduced to 100 nm, 75 nm and 50 nm respectively.

On the other hand, it has been recently found that a charge of approximately 200 fc (femtocoulomb) at maximum is created in a Si substrate by an α particle radiated from a radioactive heavy metal (U, Th, etc.) contained in the package and this causes an undesirable noise. Accordingly, it is difficult from a standpoint of stable operation to reduce the signal quantity Q below approximately 200 fc. Accordingly, it has been practiced to further reduce the thickness of the insulation film. As a result, another problem of dielectric breakdown of the insulation film has been raised. An electric field for causing dielectric breakdown in the $SiO_2$ film which is commonly used as the insulation film of the capacitor is $10^7$ V/cm at maximum. Thus, an $SiO_2$ film having a thickness of 10 nm is essentially permanently broken or degraded by an application of a voltage of 10 volts. For long term reliability, it is important to operate the memory at a voltage which is as much smaller than the maximum breakdown voltage as possible.

Figure 1:
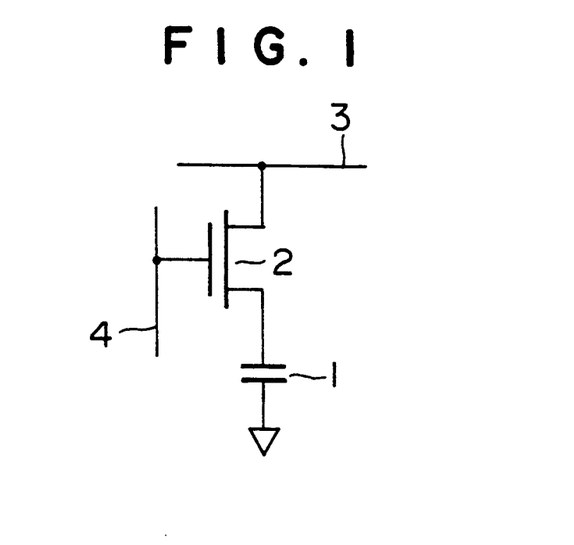
FIGS. 1, 2 and 3 show configurations of semiconductor memories each having a field effect transistor and a capacitor.

FIG. 1 shows a configuration of a one-transistor dynamic memory cell which uses an insulated gate field effect transistor (hereinafter referred to as a MOS transistor). It comprises a capacitor 1 for storing a charge and a switching MOS transistor 2, a drain of the switching MOS transistor 2 is connected to a bit line 3 and a gate thereof is connected to a word line 4.

Figure 2:
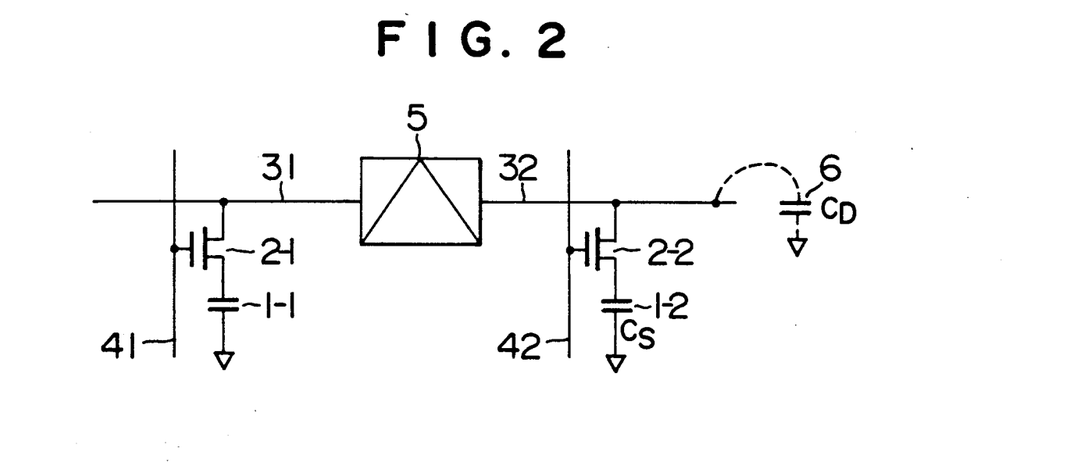

In operation, a signal charge stored in the capacitor 1 is read out by the switching transistor 2. An actual large-scale integration memory is constructed in a memory array by one of the following two major methods. FIG. 2 shows what is called an open bit line configuration in which bit lines 31 and 32 are arranged on opposite sides of a sense amplifier 5 which differentially senses signals. Only one bit line 31 electrically crosses a word line 41, and the sense amplifier 5 senses a difference between the signals on the bit lines 31 and 32.

Figure 3:
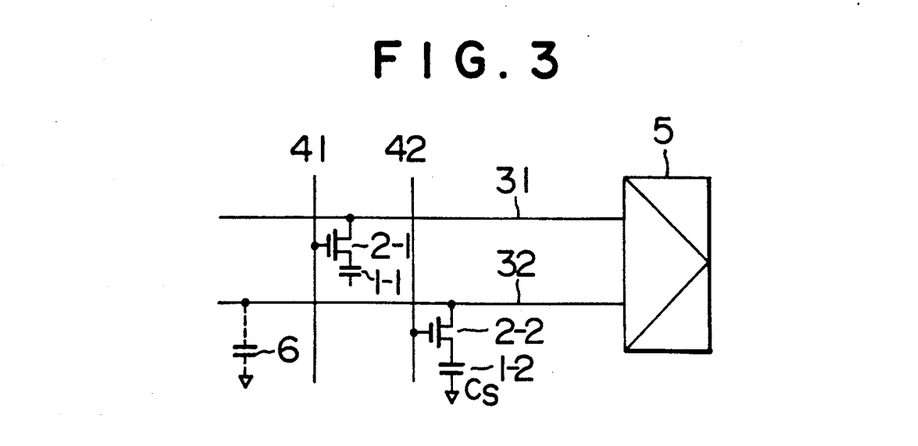

FIG. 3 shows what is called a folded bit line configuration in which two bit lines 31 and 32 connected to a sense amplifier 5 are arranged in parallel and a word line 41 crosses to two bit lines 31 and 32.

Preferred embodiments of the present invention to be described later are primarily inplemented in the folded bit line configuration although they may be implemented in the open bit line configuration.

In FIGS. 2 and 3, one of major performance indices of the memory array is $C_S/C_D$, where $C_D$ is a capacitance of a parasitic capacitance 6 of the bit line 32 and $C_S$ is a capacitance of a capacitor 1-2 of the memory cell. The S/N ratio of the memory array directly corresponds to $C_S/C_D$. It is thus important to increase the capacitance of the memory cell and reduce the parasitic capacitance $C_D$ of the bit line in order to raise the S/N ratio.

Figure 4:
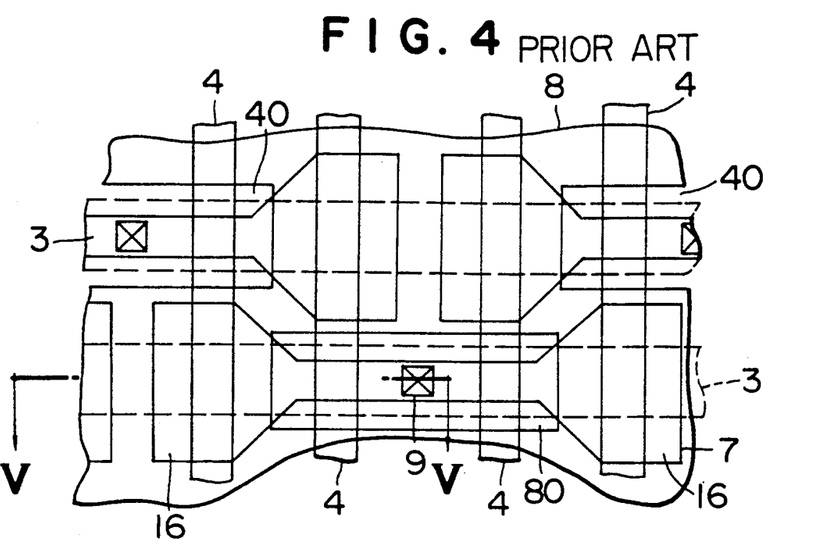
FIGS. 4 and 5 show a plan view and a sectional view of a main portion of a prior art semiconductor memory.
Figure 5:
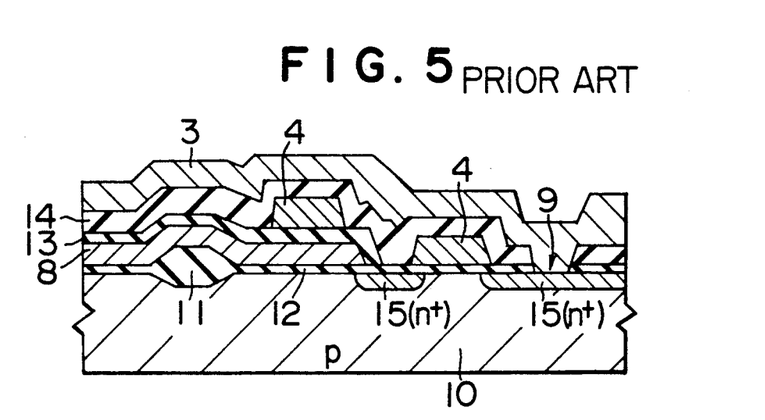

FIG. 4 shows a plan structure of a memory cell of the folded bit line configuration, and FIG. 5 shows a sectional structure thereof taken along a line V—V in FIG. 4. As seen from FIGS. 4 and 5, since a capacitor is formed at a portion in an active region 7 (shown in a dumbbell shape) encircled by a thick field oxidization film 11 which is more than 100 nm thick; the active region 7 is covered by a plate 8. However, the plate 8 is selectively removed (shown at 80 in FIG. 4) at an area at which the switching transistor is formed and at an area of a contact hole 9 through which a bit line 3 is connected to a drain (or source) 15 on a Si substrate. Word lines 4 are deposited on the area 80 and the switching transistor 2 is formed there. In some open bit line memories, the switching transistor 2 has no heavily doped region 15 adjacent to the storage capacitor. The term "transistor" will also include such versions.

The semiconductor memory described above is manufactured in the following manner. For the sake of explanation, the transistor is of n-channel type. If a p-channel type is used, the conductivity types of the Si substrate and the diffusion layer are reversed to those in the n-channel type. A field $SiO_2$ layer 11 which is approximately 100–1000 nm thick is selectively formed on a p-type Si substrate 10 having a resistivity of approximately 10 Ω-cm by a so-called LOCOS technique which uses $Si_3N_4$ as an anti-oxidization mask. Then, a gate oxide film 12 which of 10–100 nm thick is formed on the Si substrate 10 by thermal oxidization. Then, the plate 8 typically formed of poly-Si doped with phosphorus P or arsenic As is selectively deposited and a surface of the poly-Si plate 8 is oxidized to form a first interlayer oxide film 13. Then, the word lines 4 typically formed of poly-Si, Mo silicide or a refractory metal (Mo or W) are deposited and phosphorus P or arsenic As ions are implanted. Thus, n+ diffusion regions 15 are formed at areas on which the plate 8 and the word lines 4 are not deposited, to form a source and a drain of the switching MOS transistor 2. Then, a phospho-silicate glass (PSG) 14 is deposited to a thickness of 500-1000 nm by a so-called CVD method which contains phosphorus and the contact hole 9 is formed at the area at which the bit line 3 typically formed of an Al electrode is to be connected to the diffusion layer 15. Then, the bit line 3 is selectively deposited thereon.

In the memory cell thus fabricated, the area 16 of the memory capacitor 1 naturally decreases as the size of the memory cell itself decreases. Thus, unless the thickness of the gate oxide film 12 is reduced, the capacitance $C_S$ is reduced as described above and it raises a big problem in the memory operation.

In order to resolve the above problem, it has been proposed by one of the inventors of the present invention to form a narrow groove in the silicon substrate and to form a memory capacitor on the surface of the groove (Japanese Laid-Open Patent Application 51-130178). Since the proposed memory utilizes the side walls and the bottom surface of the groove as electrode surfaces of the capacitor, it can increase the electrode area much more than the memory shown in FIGS. 4 and 5 without increasing the plan area. However, in order to further increase the integration density of the semiconductor IC, the area occupied by the memory cell must be further reduced.

It is an object of the present invention to provide a semiconductor memory having a reduced occupation area and a method for fabricating the same.

It is another object of the present invention to provide a semiconductor memory having a capacitance of an excellent characteristic and a sufficiently small occupation area, and a method for fabricating the same.

It is a further object of the present invention to provide a semiconductor memory having a sufficiently large capacitance without reducing a thickness of an insulation film, and a method for fabricating the same.

In accordance with an aspect of the present invention, a storage capacitor of the semiconductor memory is formed by utilizing a groove formed in a semiconductor substrate and a memory cell of the semiconductor memory is formed in a highly doped area formed in the semiconductor substrate so that a distance between adjacent capacitors can be reduced.

The present invention will be apparent from the following detailed description taken in conjunction with the accompanying drawings, in which:

As described above, a memory has already been proposed in which the storage capacitor is formed in a groove formed in the substrate in order to increase the capacitance without increasing the plan area.

Figure 6:
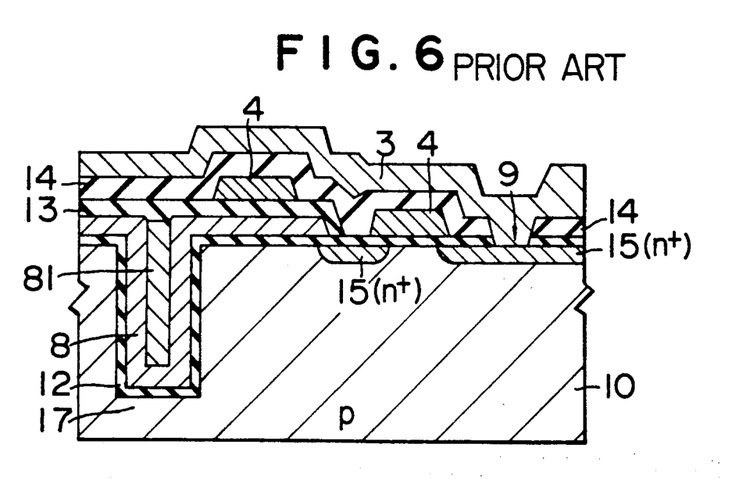
FIGS. 6 and 7 show a sectional view and a plan view of another prior art semiconductor memory.

As shown in a sectional view of FIG. 6, an insulation film 12 and a plate electrode 8 comprising a poly-Si film 1 are formed on a groove 17 formed in a semiconductor substrate 10, thereby to form a capacitor.

Since the side walls and the bottom surface of the groove are utilized as the capacitor, the capacitance can be increased without increasing the plan area.

However, since an actual memory includes a number of memory cells each having a transistor and a capacitor, a problem of interference among the cells arises.

Figure 7:
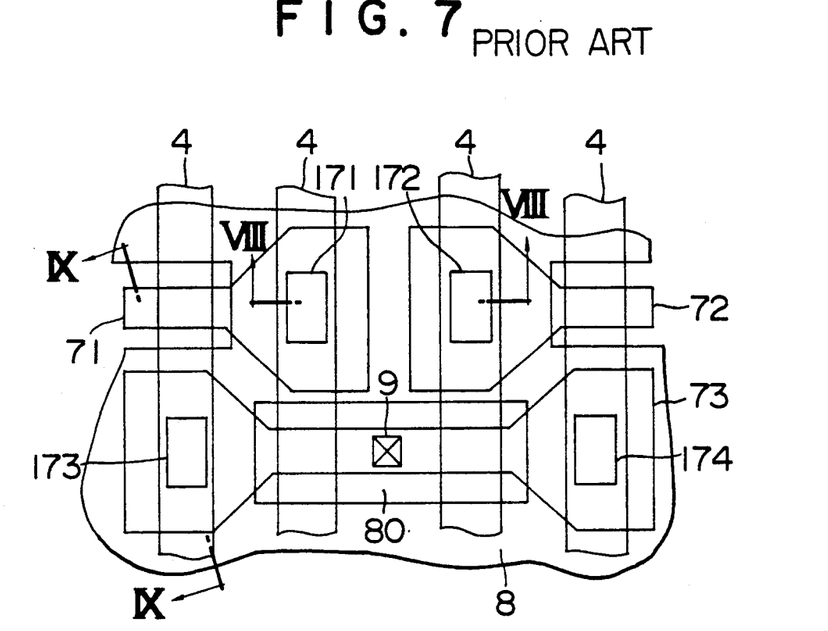

As shown in a plan view of FIG. 7, the memory shown has four grooves 171-174 which are to form the capacitors. The interference between the adjacent memory cells includes an interference between the grooves (VIII—VIII section) and an interference between the groove and the diffusion (IX—IX section).

Figure 8:
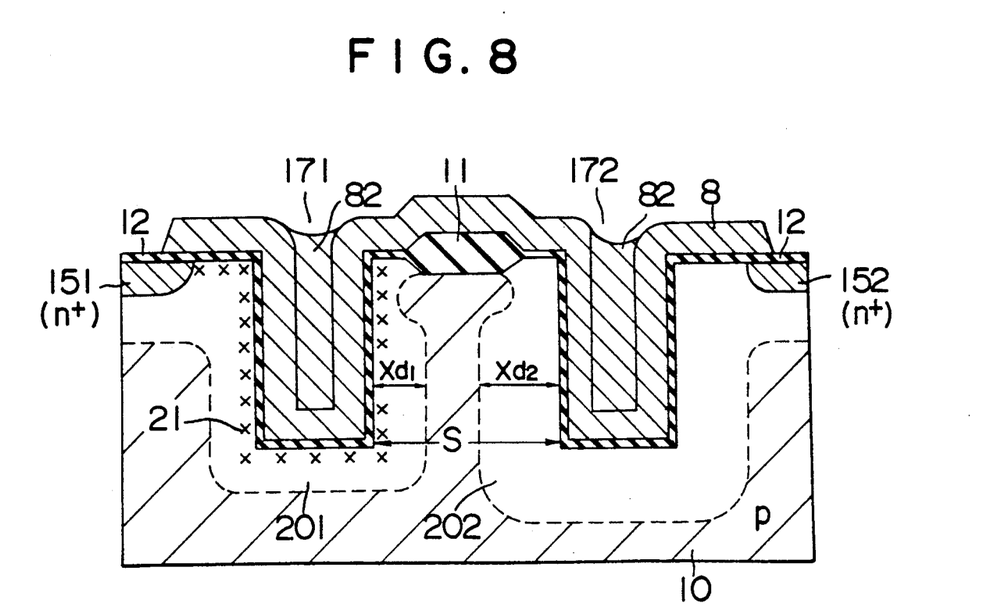
FIGS. 8 and 9 illustrate a principle of the present invention.

FIG. 8 illustrates the interference between the grooves 171 and 172. The grooves 171 and 172 face each other with the field oxide 11 being interleaved therebetween, and depletion layers 201 and 202 are formed therearound. According to a depletion width approximation which is simplified as much as possible while not injuring an essense of physics, the depletion width is given by $$Xd_{max} = \sqrt{\frac{2\epsilon_s(2|\phi_F| + V_C)}{qN_a}}$$

when carriers 21 are not present at an interface between the gate insulation film 12 and the Si substrate 10, where $\delta_s$, $\phi_F$, q and $N_a$ are a dielectric constant of the Si substrate 10, a Fermi level, the magnitude of an electronic charge ($=1.6\times10^{-19}$C) and an impurity concentration in the Si substrate, respectively. Since the gate insulation film 12 is usually sufficiently thinner than the depletion layer, $V_C$ may be approximated as a voltage $V_a$ applied to the plate 8. Thus, the depletion layer expands approximately in proportion with a square root of the applied voltage. When the carriers are present at the interface to the thermal equiliblium condition (inversion layer), the thickness of the depletion layer is given by $$Xd_{min} = \sqrt{\frac{4\epsilon_s\phi_F}{qN_a}}.$$

As shown in FIG. 8, as the depletion layers 201 and 202 expand toward each other, exchange of current (transport of carriers) between the depletion layers 201 and 202 exponentially increases with a decrease in potential barrier. For example, assuming that $N_a$ is $1\times3^{15}$/cm$^3$ and $V_C$ is 5 volts as is usual in an ordinary memory cell $Xd_{max}$ is nearly equal to 2.5 μm and $Xd_{min}$ is equal to 0.8 μm. Taking a variation during the fabrication process into consideration, a further margin is required. Accordingly, as a minimum distance $S_{min}$ between the grooves 171 and 172 approaches a sum of $Xd_{max}$ and $Xd_{min}$, that is, 3.3 μm (=2.5 +0.8) and is further reduced, the carriers stored in one groove wall flow to the other groove and the stored information is lost. If the carriers move to the groove having no carrier, the depletion layer shrinks accordingly and the depletion layer around the groove which lost the carriers expands, thereby to keep a balance.

Since the dynamic RAM is volatile for the stored information, it is usually rewritten (or refreshed) at every 20 ms, although this period may change depending on a memory scale and a memory configuration. Thus, a signal quantity which can be reproduced during that period should be held. Accordingly, it is not possible to simply use a contact or non-contact condition of the depletion layers as a decision criterion. However it is an effective way for holding the information to set $S_{min} > Xd_{max} + Xd_{min}$. When none of two adjacent grooves 171 and 172 has the carriers, the both grooves have the maximum depletion layer width $Xd_{max}$, and even if they contact to each other, the information is not broken because both do not have the carriers.

Figure 9:
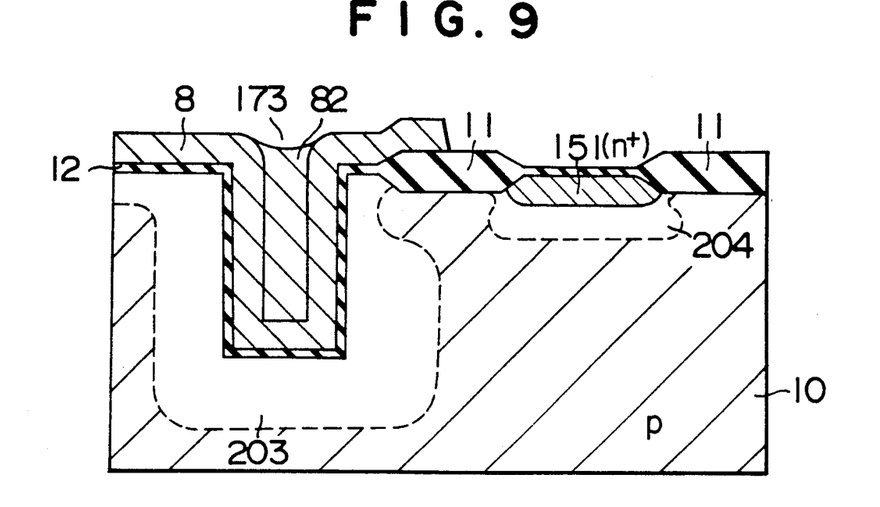

As shown in FIG. 9, the interference between the groove 173 and the diffusion layer 151 occurs in addition to the interference between the grooves. This interference is basically identical to the interference between the grooves.

It is necessary to reduce the distance between the grooves in order to increase the integration density of the memory cell.

Figure 10:
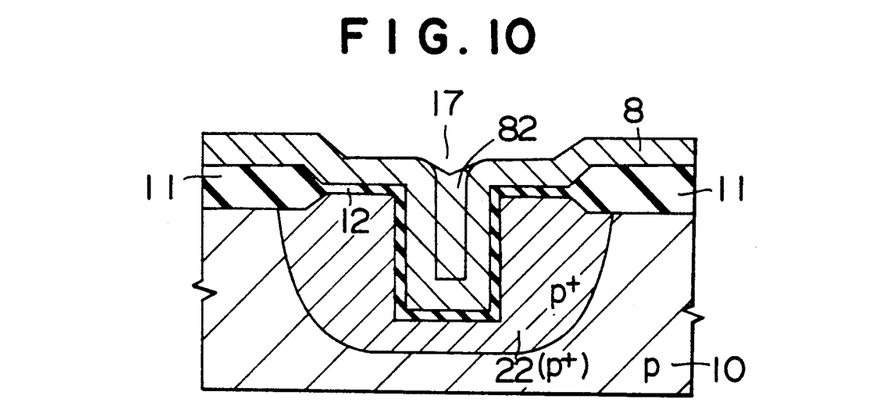
FIGS. 10, 11, 12 and 13 show different embodiments of the present invention.

In accordance with an aspect of the present invention, the distance between the adjacent grooves and the distance between the groove and the diffusion layer can be reduced if a highly doped region (well) relative to and having the same conductivity type as the substrate 10 is formed at an area in which the groove 17 is formed, as shown in FIG. 10. By forming the groove 17 in the highly doped region 22, the impurity concentration $N_A$ is increased and hence the thickness of the depletion layer is reduced as seen from the above formula of $Xd_{min}$, and the distance between the adjacent grooves can be reduced.

In order to increase $N_A$, it is a simple way is to increase an impurity concentration in the whole surface area of the substrate 10. In this case, however, a peripheral circuit other than the memory cell will also be influenced. Such an influence, when not desirable, can be avoided by forming a large area well having the same conductivity type as the substrate and forming a memory cell therein. In order to form the well in the p-type substrate, a p-type impurity such as boron (B) is ion-implanted to a concentration of $1 \times 10^{12} - 1 \times 10^{14}$ cm$^{-2}$ and it is diffused to a predetermined depth by heat treatment at 1000°–1200° C.

In FIG. 10, one well is formed for each groove, and each groove is formed in a separate well. It should be understood that two or more grooves may be formed in one well and an entire memory array containing a plurality of memory cells may be formed in one well. In this case, however, the switching transistor regions will also be formed in the highly doped region.

Figure 11:
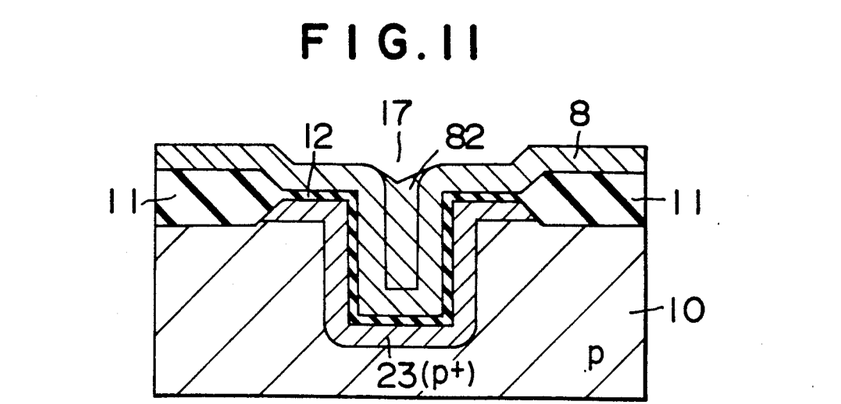

When insulated gate field effect transistors are also formed in the relatively highly doped region 22, the threshold voltage of the transistors will also be influenced. Then, the impurity concentration of the relatively highly doped region or well 22 may be of the order of $10^{15}$ to $10^{17}$ cm$^{-3}$, and more preferably of the order of to $10^{16}$ cm$^{-3}$, which concentration is still higher than that of the substrate 10. In order to avoid this problem, after the groove 17 to be used as the capacitor has been formed, an impurity is doped from the surface of the Si substrate 10 by a thermal diffusion method to form a highly doped layer 23 of the same conductivity type as the substrate only in the surface layer, as shown in FIG. 11. When the ion implantation is used instead of the thermal diffusion, the ions have a property of straight going. Thus, in order to dope the impurity to the side walls of the groove 17, the ions may be implanted obliquely. Alternatively, sputtering by the ion implantation at an acceleration voltage of lower than 10 keV may be utilized.

Figure 12:
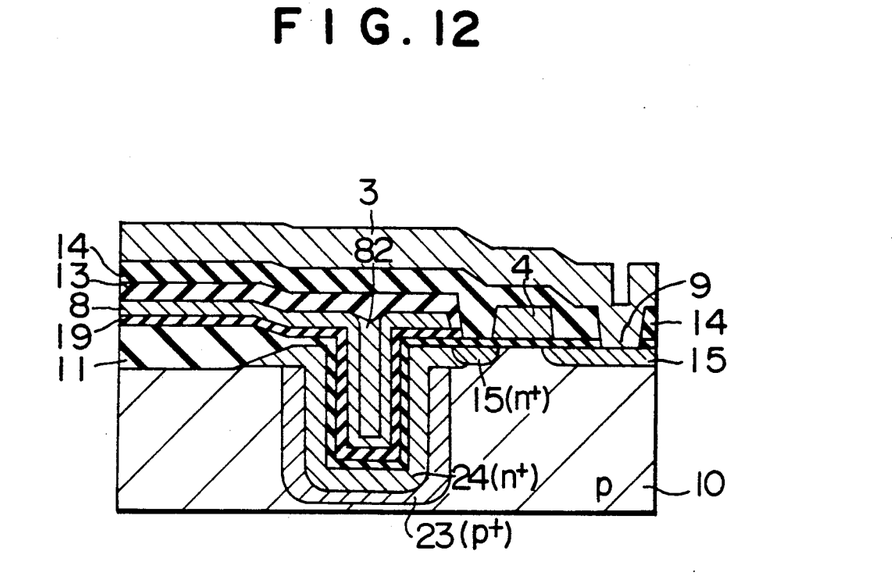

In the embodiments described above, the inversion layer of the MOS capacitor (here, the letter M includes poly-silicon as well as metal) is used as the capacitor of the memory cell. In a semiconductor memory which uses a capacitor between the n+ layer and the plate 8, the expansion of the depletion layer can be suppressed in similar way. FIG. 12 shows a sectional view of a memory cell having such a capacitor. After the groove 17 has been formed, a relatively highly doped p type region 23 is formed and then an n+ region 24 having the same conductivity type as the diffusion layer 15 of the switching transistor, that is, a n+ capacitor electrode layer 24 is selectively formed in the capacitor area by a photo-etching and selective doping method. In order to dope the impurity to the side walls of the groove by the directional ion implantation method, As or P ions may be implanted obliquely or the acceleration energy is lowered below 10 KeV to positively utilize the ion sputtering. Alternatively, a thermal diffusion method using POCl$_3$ may be used or glass containing As or P may be selectively deposited and it is heated to diffuse As or P.

It should be understood that one or more memory cells with heavily doped capacitor electrodes as shown in FIG. 12 can alternatively be formed in a highly doped region 22 having the same conductivity type as the substrate, shown in FIG. 10.

Figure 13:
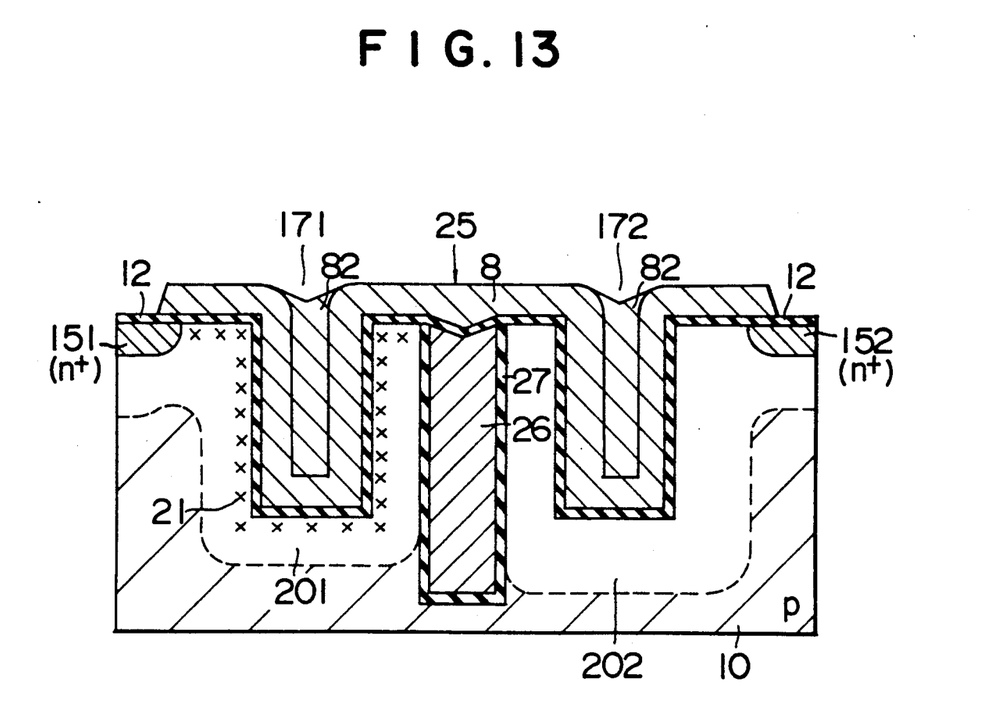

In the embodiments described above, the field area is formed by the oxide film 11. Alternatively, an isolation groove 25 formed in the substrate as shown in FIG. 13 may be used, instead of the oxide film, as an isolation area between the memory cells. FIG. 13 shows another embodiment of the present invention, in which the isolation is attained by the groove 25 instead of the field oxide film 11 shown in FIG. 8. An isolation insulative layer 27 comprising a single SiO$_2$ film or a composite film of the SiO$_2$ film and a Si$_3$N$_4$ film is deposited to a thickness of 10–200 nm on the surface of the isolation groove 25 formed on the Si substrate 10, and a filler 26 of poly-Si is filled. During or after the deposition of the poly-Si 26, phosphor or As may be doped to render the poly-Si 26 conductive. Alternatively, the poly-Si 26 may be insulative. When the poly-Si 26 filled in the groove 25 is kept at ground level or even at the same level as a power supply voltage Vcc, the groove can isolate the depletion layers 201 and 202 which expands on both sides thereof. When the poly-Si is at Vcc level, it is preferable to form a highly doped region (not shown) of the same conductivity type as the substrate at the bottom of the groove 25. Thus, the distance between the grooves 171 and 172 can be reduced and hence the integration density of the memory can be increased.

While FIG. 13 shows the embodiment in which the capacitor is formed by the inversion layer, it should be understood that the isolation can also be attained by the groove when the diffused capacitor electrode as shown in FIG. 12 is used.

For the sake of description, the n-channel type memory has been explained. In a p-channel type memory, all conductivity types are to be reversed. Thus, it is apparent that the present invention is applicable to not only the n-type memory but also to the p-type memory.

While the folded bit line configuration is explained in the above description of the present invention, it is apparent that the present invention is also applicable to the open bit line configuration.

EMBODIMENT 1

Figure 14:
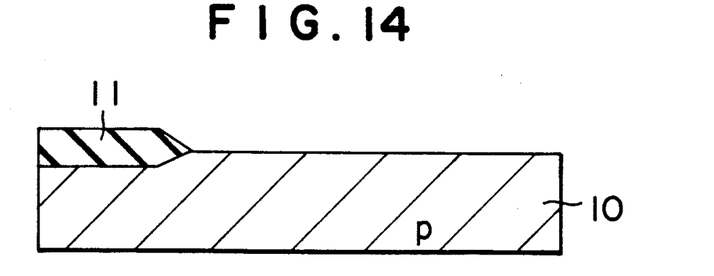
FIGS. 14-19 show manufacturing steps in according with one embodiment of the present invention.
Figure 15:
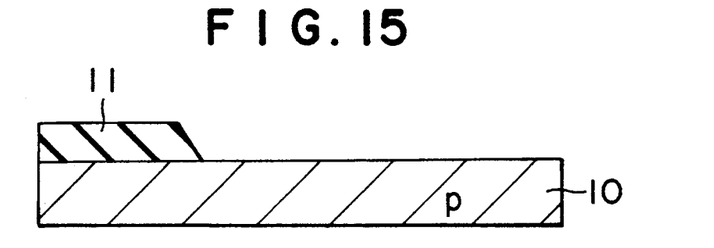
Figure 16:
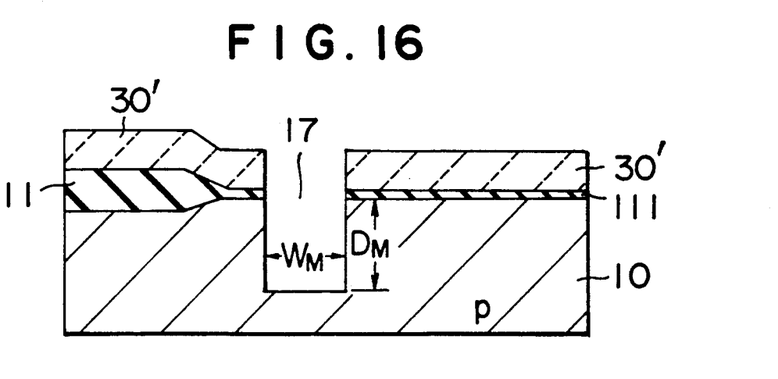

Referring to FIG. 14, a field $SiO_2$ film 11 of 500–1000 nm thick is selectively formed on a p-type Si substrate 10 of about 10 Ω-cm by the LOCOS method. The field $SiO_2$ film may alternatively be formed by first forming a $SiO_2$ film on an entire surface of the Si substrate and then removing unnecessary areas by photo-etching as shown in FIG. 15. As shown in FIG. 16, after a thin $SiO_2$ film 111 has been formed on the surface of the Si substrate 10, an etching groove 17 is formed at a predetermined area on the Si substrate 10 by a parallel plate plasma etching which uses a photoresist as a mask and gas primarily consisting of $CF_4$, $SF_6$ or $CCl_4$ or mixture of them and H as a reaction gas. When a conventional photoresist film is used as the plasma etching mask, the mask may be etched. Therefore, $SiO_2$, $Si_3N_4$ and CVD $SiO_2$ films are deposited, in this order, on the Si substrate 10 and the resulting composite film is used as the mask, and the Si substrate 10 is dry-etched to form the groove 17. The $Si_3N_4$ film serves to prevent the field $SiO_2$ film 11 from being etched when the CVD $SiO_2$ film as the mask is finally removed. Accordingly, a film of any other material which meets the requirements may be used. The CVD $SiO_2/Si_3N_4/SiO_2$ composite film is used only as a mask which is finally removed and does not finally remain on the Si substrate 10. Therefore, a mask of any other material which meets the requirement may be used. Alternatively, where it is possible to selectively etch a desired area on the Si substrate 10 by a fine beam, the etching groove 17 can be formed without the mask.

When the dry etching such as plasma etching or sputter etching is used, electrical or crystalline contamination or defect may be produced in the Si substrate 10. Accordingly, it is desirable to remove the contamination or defect by wet etching which uses mixed solution of $NH_4OH$ and $H_2O_2$ or HF and $HNO_3$, etc. after the groove 17 has been dry-etched.

The depth of the etching groove 17 formed is not limited in principle, but it is practical that the depth $D_M$ is approximately $0.5 \ W_M$ –$5 \ W_M$, where $W_M$ is the width of the groove 17.

Figure 17:
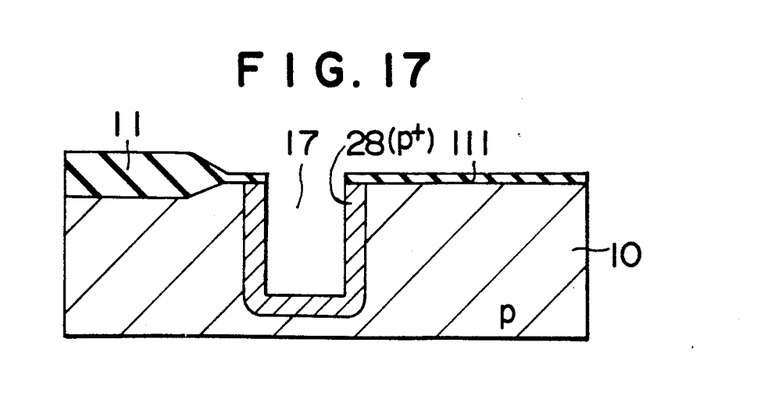

As shown in FIG. 17, an impurity is introduced by a self-alignment method to the side walls and the bottom of the groove 17, using the $SiO_2$ film 111 or the CVD $SiO_2/SiO_2$ composite film which was used as the mask to form the groove 17, as a diffusion mask, by a well-known method such as boron thermal diffusion using BN, to form a P+-type diffusion layer 28. The impurity may be introduced by the ion implantation. While ions go straight by the ion implantation, the ions can be implanted to the side walls of the groove 17 by implanting the ions obliquely or utilizing the sputtering by the ion implantation. In addition to the P+ diffusion layer 28, an n+ diffusion layer may be formed inside the P+ diffusion layer 28, as mentioned in connection with FIG. 12.

An insulation film of a capacitor is next formed. The insulation film may be of any material, in principle, so long as it has a high breakdown voltage and is stable. For example, $SiO_2$ or $Si_3N_4$ formed by thermal nitrization or CVD, or $Ta_2O_5$, $TiO_2$ or $Nb_2O_5$ formed by CVD or reactive sputtering may be used. The capacitor insulation film may be a single layer or a multi-layer. In the present embodiment, a composite film of $SiO_2$ and $Si_3N_4$ is used.

Figure 18:
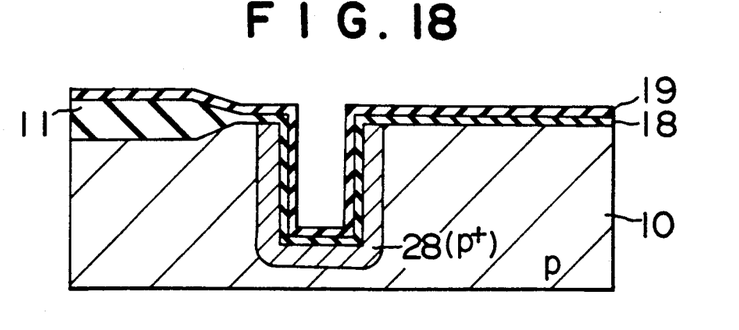

After the $SiO_2$ film 111 or the CVD $SiO_2/Si_3N_4/SiO_2$ composite film used as the mask to form the diffusion layer 28 has been removed, a $SiO_2$ film 18 of 5–20 nm thick is formed by a thermal oxidation at a temperature of 900°–1200° C. as shown in FIG. 18. Then, a capacitor $Si_3N_4$ film 19 of 5–20 nm thick is deposited by the CVD method at 650°–850° C. The thicknesses of those films are selected depending on desired capacitance per unit area and breakdown voltage and hence they may depart from the ranges described above. The CVD $Si_3N_4$ film usually has a very large internal stress of up to $1 \times 10^{10}$ dyn/cm². Thus, if it is directly deposited on the Si substrate 10, defects may be created, resulting in the deterioration of the characteristic. In order to avoid such a problem, it is effective to form a $SiO_2$ film under the $Si_3N_4$ film. When the Si substrate 10 is directly nitrized to form the $Si_3N_4$ film, such a problem does not occur and a fine film having a high breakdown voltage is formed. However, a reaction rate is very slow and a reaction time of more than one hour is required to form a film of more than 10 nm thick. A film thickness increase rate rapidly decreases after the film thickness has exceeded 10 nm. Accordingly, it is difficult to form a thick $Si_3N_4$ film by direct nitrization. The surface of the $Si_3N_4$ film 19 may be oxidized to the thickness of 2–5 nm in order to improve the breakdown property.

Figure 19:
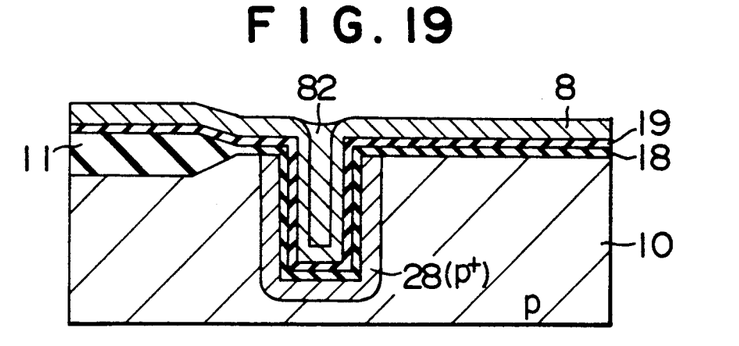

As shown in FIG. 19, the plate 8 which is represented by poly-Si is deposited on the entire surface. When the poly-Si is deposited by CVD, it enters into the groove 17 and is deposited thereon. Thus, the thickness of the poly-Si film 8 deposited on the side walls of the groove 17 is substantially equal to the thickness of the poly-Si film 8 deposited on the bottom of the groove 17. Then, phosphorous is thermally diffused into the poly-Si film 8 by using $POCl_3$ gas. When $W_M > 2T_{S1}$ (where $W_M$ is the width of the etching groove 17 and $T_{S1}$ is the thickness of the poly-Si film 8), a groove (having a groove width of $2T_{S2}$) remains as shown in FIG. 19. This groove is to be filled because it adversely affects to an insulation film deposited on the upper surface thereof and the deposition of the word line 4. In the present embodiment, poly-Si is deposited to the thickness of $T_{S2}$ as shown in FIG. 19 and then it is removed by the thickness of $T_{S2}$ by the well-known plasma etching method using $CF_4$ or $SF_6$ gas so that the poly-Si film 82 is left embedded in the groove as shown in FIG. 19. As a result, the upper surface is flattened. If the groove is filled by one step of deposition of poly-Si, a second step of deposition is not necessary. Since the plate 8 is also used as a wiring element, an appropriate thickness thereof is in the order of 100–500 nm. If the groove is not filled by the first step of deposition, the poly-Si is deposited in the second step to fill the groove.

If the poly-Si is directly deposited on the poly-Si film 8 in the second step and then it is etched, the end point of the etching is not clear because the boundary is fused. Thus, the surface of the poly-Si film 8 is thermally oxidized to the depth of 5–30 nm to form a $SiO_2$ film. In this case, when the second poly-Si film has been entirely etched, the SiO₂ film on the surface of the first poly-Si film 8 is exposed. Since the etching rate of the plasma etching for the poly-Si is more than ten times as high as that for the SiO₂, the first poly-Si layer 8 is protected by the SiO₂ film and is not etched even if the SiO₂ film is slightly overetched.

As seen from FIG. 19, according to the present embodiment, the capacitor which has the poly-Si plate 8, and the composite insulation film of the SiO₂ film 18 and the Si₃N₄ film 19, and is encircled by the P+ diffusion layer 28 is formed in the groove 17 formed in the substrate 10. It will be apparent that the P type substrate may be substituted by a P type well in an n type or insulative substrate.

EMBODIMENT 2

Figure 20:
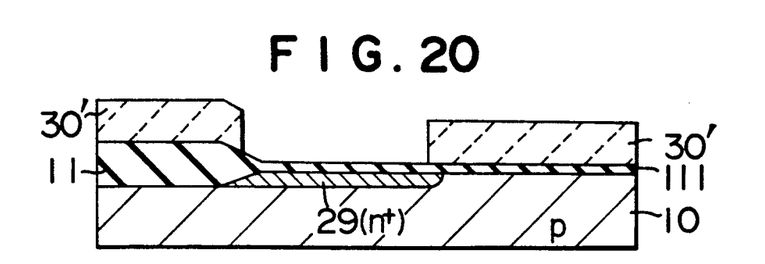
FIGS. 20-24 show manufacturing steps in accordance with another embodiment of the present invention.

The thick SiO₂ film 11 and the thin SiO₂ film 111 are formed on the P-type Si substrate 10 by the method shown in FIG. 14 or 15, and then an n-type impurity such as As or P is ion-implanted by using a photo-resist film 30 as a mask to form a planar electrode layer 29, as shown in FIG. 20.

Figure 21:
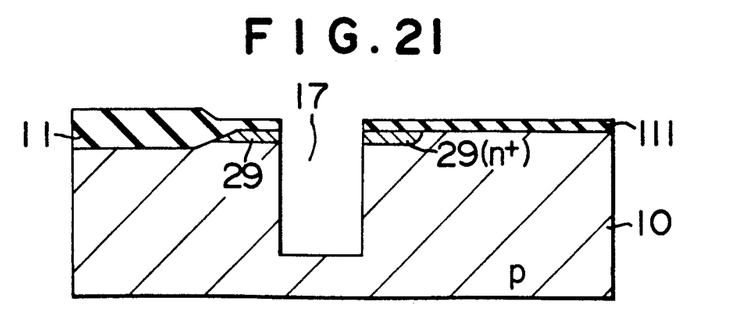

After the photo-resist mask 30 has been removed the groove 17 is formed by using the SiO₂ film 111 as a mask in the same manner as the Embodiment 1, as shown in FIG. 21.

Figure 22:
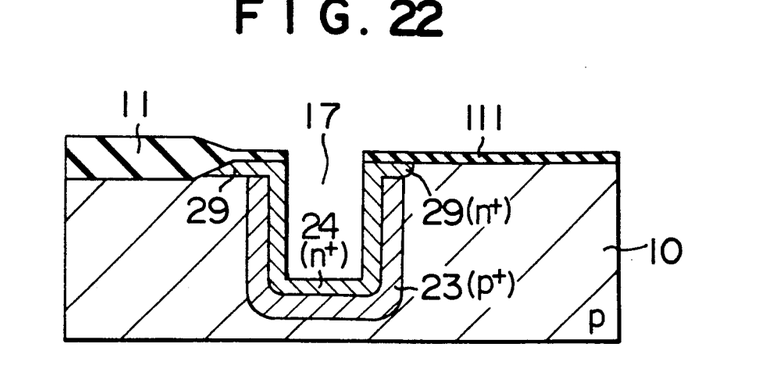

As shown in FIG. 22, boron is diffused by the well-known impurity diffusion method to form a p+-type diffusion layer 23, and phosphorus or As is diffused to form an n+-type diffusion layer 24 which serves as a capacitor electrode.

Figure 23:
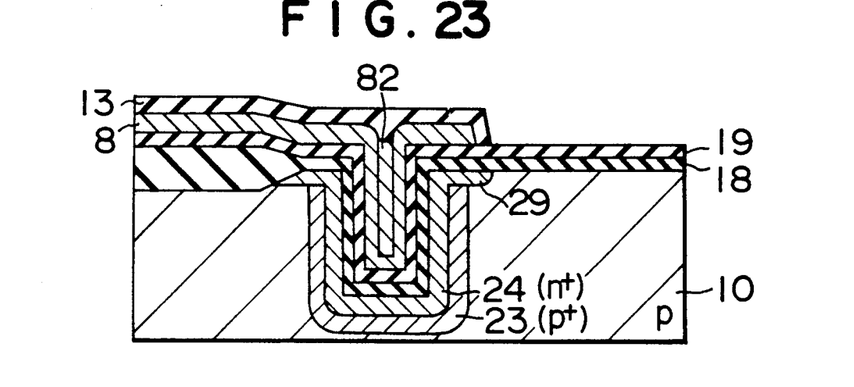

Then, the insulation films 18 and 19, the poly-Si plate 8, the poly-Si film 82 and the insulation film 13 are formed in the same manner as the Embodiment 1. Thus, as shown in FIG. 23, the capacitor which is encircled by the p+-type diffusion layer 23 and has the n+-type capacitor electrode 24 is formed in the groove 17 formed in the substrate 10.

Figure 24:
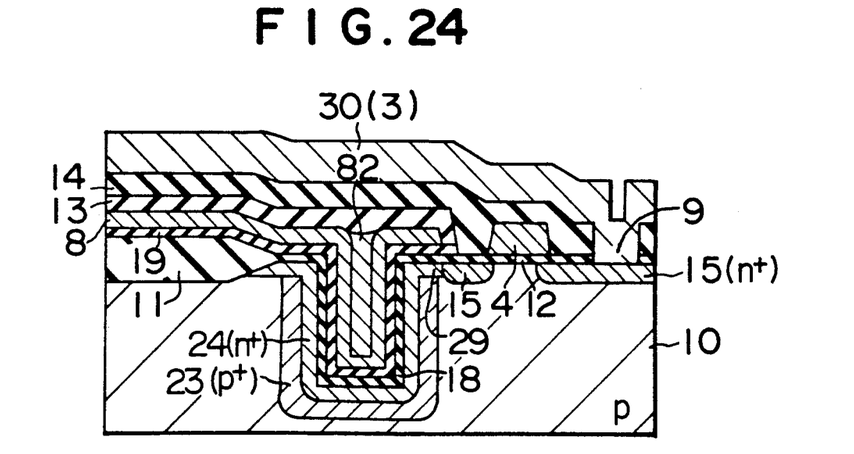

The surface of the plate 8 is oxidized to form a first interlayer oxide film 13 of 100–400 nm. The Si₃N₄ film 19 is not substantially oxidized in this step. Then, exposed areas of the Si₃N₄ film 19 and the SiO₂ film 18 are etched by using the first interlayer oxide film 13 as a mask, and a gate oxide film 12 of 10–50 nm thick is formed by the oxidation by dry oxygen containing 1–5% of HCl, at 800°–1150° C. Then, a gate (word line 4) of single or composite layer of poly-Si and/or silicide (such as Mo₂Si), or a refractory metal such as W or Mo is selectively deposited on a selected area. Then, as shown in FIG. 24, As or phosphorus is ion-implanted at an acceleration energy of 60–120 KeV to form n+ source/drain regions 15 at the area not covered by the plate 8 and the gate 4. One of the n+ source/drain regions 15 formed is connected to an n+ planar electrode 29 as shown in FIG. 24.

A second interlayer insulation film 14 of CVD SiO₂ containing 4–10 mol% of phosphorus is deposited to a thickness of 300–1000 nm and it is heat-treated at 900°–1000° C. Then, electrode connection holes 9 reaching to the n+-type source/drain region 15, the gate 4 and the plate 8 are formed and Al electrodes 30 are selectively deposited (only the bit line 3 is shown). Thus, a one-transistor dynamic memory having the side walls of the etching groove 17 as a portion of the capacitor is formed. Since the capacitor of the memory cell shown in the present embodiment is formed between the capacitor electrode 24 and the plate 8, the potential of the plate 8 may be fixed, for example to ground level. By grounding the plate 8, a noise can be reduced. This is advantageous to the memory operation. Since the groove 17 is encircled by the p+-type layer 23, the width of the depletion layer extending from the side wall of the groove 17 is reduced. As a result, a leakage current between the adjacent memory cells is reduced and the distance between the adjacent cells is also reduced. This is very advantageous to the high integration density of the memory cell.

EMBODIMENT 3

The highly doped diffusion layers 28 and 23 for suppressing the expansion of the depletion layer need only encircle the groove 17 as shown in the Embodiments 1 and 2. Accordingly, one or more memory cells can be formed in the highly doped diffusion layer, and a memory not including a plurality of memory cells can be formed in the highly doped diffusion layer.

Figure 25:
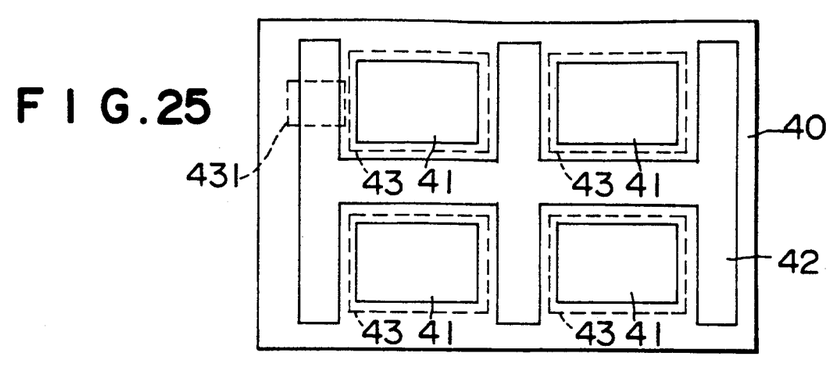
FIG. 25 shows a diagram for illustrating another embodiment of the present invention.

As shown in a plan view of FIG. 25, memory cell mats 41 each including a plurality of memory cells and a peripheral circuit 42 for driving the memory cell mats 41 are formed in a memory chip 40. Alternatively, a large area highly doped diffusion layers (well) 43 may be formed and the memory mats 41 may be formed therein.

Areas 43 enclosed by broken lines in FIG. 25 are highly doped diffusion areas of the same conductivity type as the substrate, and the memory cells 41 are formed therein. As a result, a distance between the memory cell capacitors can be reduced.

Not only the memory cell 41 but also a portion of the peripheral circuit 42 may be formed in the large-area highly doped diffusion area 43.

The highly doped diffusion areas 43 are formed by implanting the impurity (boron in this case) of the same conductivity type as the substrate before or immediately after the formation of the field oxide film 11 and heat-treating it.

EMBODIMENT 4

In the present invention, the plane shape of the groove 17 in which the capacitor is formed may vary widely.

Figure 26:
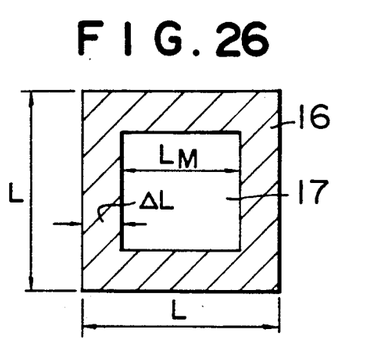
FIGS. 26-30 show examples of plan shapes of capacitor grooves usable in the present invention.

One of typical shapes is square or rectangular in plan view as shown in FIG. 26. If the bottom of the etching groove 17 is identical to the top thereof, a capacitor area as viewed from the top does not change. Thus, by the addition of the etching groove 17, the capacitor area increases by $L_M \times D_M$ where $L_M$ is the circumferential length of the etching groove 17 and $D_M$ is the depth thereof. For example, when the plan area of the capacitor area 16 is 3 μm square and the groove 17 of 1 μm in width and 2 μm in depth is formed, the plan area is 9 μm² and the side wall area of the etching groove 17 is $1 \times 4 \times 2 = 8$ μm². Accordingly, by adding the etching groove 17 of 1 μm in width and 2 μm in depth, the capacitor area increases from 9 μm² to 17 μm² (=9 +8), that is, the capacitor area is approximately doubled. As a result, the S/N ratio of the input signal to the sense amplifier 5 is approximately doubled and a remarkable advantage is obtained in the stable operation of the memory.

Figure 27:
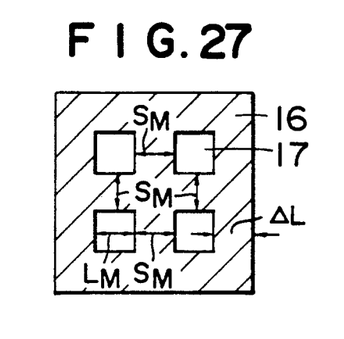

In the embodiment of FIG. 26, the groove 17 is square. FIG. 27 shows another embodiment having a plurality of grooves. In FIG. 26, the edge of the groove 17 is spaced from the edge of the capacitor area by a distance $\Delta L$. The capacitor area is $L \times L$ and the peripheral length $L_M$ of the etching groove 17 is 4 ($L - 2 \Delta L$).

FIG. 27 shows an embodiment which has four square grooves. A distance between the adjacent etching grooves 17 is $S_M$, and the total peripheral length of the four etching grooves is 8 ($L - 2 \Delta L - S_M$). In order to comprehend the difference between the peripheral lengths of the embodiments of FIG. 26 and FIG. 27, let us assume that $L = 5$ $\mu$m and $\Delta L = S_M = 1$ $\mu$m. Thus the peripheral length $A_1$ in the embodiment of FIG. 26 having one groove is 12 $\mu$m while the peripheral length $A_4$ in the embodiment of FIG. 27 having four grooves is 16 $\mu$m.

Accordingly, in general, it is more advantageous to form a plurality of grooves than to form one groove. Assuming that a minimum dimension attainable by the lithography method is $L_{min}$, it is most advantageous to set the width $L_M$ of the etching groove and the distance $S_M$ between the grooves equal to $L_{min}$. If one of $L_M$ and $S_M$ is larger than the other, the smaller one is to be set equal to $L_{min}$.

Figure 28:
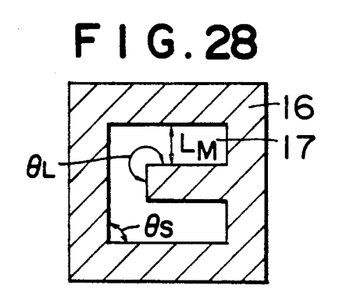

FIG. 28 shows an embodiment in which the width $L_M$ of the groove 17 is fixed and a recess is formed in the square area shown in FIG. 26. The peripheral length is increased over that of FIG. 26 by the inwardly extending side walls.

Figure 29:
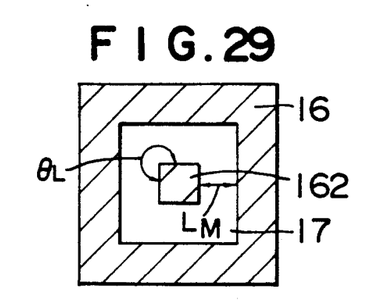

FIG. 29 shows an embodiment in which a post-shaped capacitor area 162 is encircled by the groove 17 having the width $L_M$. Since the side walls of the post 162 formed in the groove 17 are added to the square groove shown in FIG. 26, the capacitor area is increased.

In the grooves shown in FIGS. 28 and 29, each of the grooves has portions (shown by $\theta_L$ in FIGS. 28 and 29) at which the inner wall is folded at an angle larger than 180 degrees. The edge of the pattern formed by the lithography method rarely has an absolute straight line but usually as a curvature of radius $\gamma$. Yet, these configurations can be defined by having an angle of over 180 degrees. In other words, these configurations may be featured by providing a convex portion on the inner wall.

Figure 30:
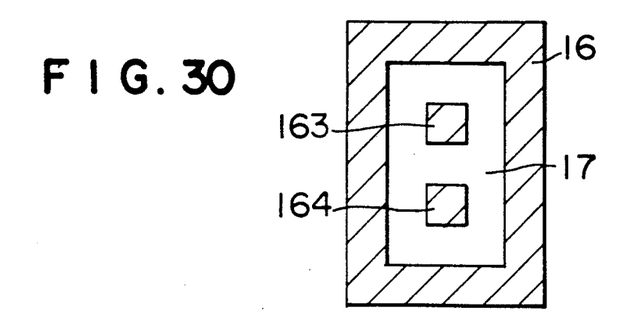

FIG. 30 shows an embodiment in which a plurality of posts 163 and 164 are formed in the groove 17. Again, a large capacitor area is attained with a given plan area.

In the prior art, it has not been possible to greatly reduce the distance between the side walls of the grooves because of the expansion of the depletion layer. In the present invention, since the expansion of the depletion layer is effectively suppressed by the highly doped region of the same conductivity type as the substrate, the distance between the grooves in which the capacitors are formed can be reduced much more than the attainable in the prior art.

As a result, the capacitor area can be increased by various means such as by forming the capacitor by a plurality of small grooves as shown in FIG. 27, forming the recess in the groove as shown in FIG. 28 or forming the posts in the groove as shown in FIGS. 29 and 30, and the capacitor area can be increased much more than the prior art with the griven plan area. The capacitance itself can also be increased to some extent by the highly doped region.

Thus, the integration density of semiconductor memory devices, etc. can be increased.

What is claimed is:

1. A semiconductor memory comprising:
   capacitors formed at a main surface of a semiconductor substrate for storing information;
   insulated-gate field effect transistors formed at said main surface of the substrate for reading out the signal charges stored in said capacitors;
   word lines for applying signals to a gate electrode of the insulated-gate field effect transistors; and
   data lines for reading out the information stored in said capacitors,
   wherein the capacitors each include an electrode, the electrode having a first side wall and a second side wall, the first and second side walls being formed substantially vertical to the main surface of the substrate, and the second side wall being surrounded by the first side wall, said capacitor further including a capacitor plate, wherein said capacitor plate is formed adjacent to the first and second side walls and is separated from the first and second side walls by an insulating layer so that said first and second side walls respectively face predetermined portions of the capacitor plate and are respectively separated from said predetermined portions of the capacitor plate by said insulating layer,
   wherein a source or drain of each of said insulated-gate field effect transistors is respectively connected to said electrode,
   wherein a drain or source of each of said insulated-gate field effect transistors is connected to one of said data lines, and
   wherein the gate electrode of each of said insulated-gate field effect transistors is connected to one of said word lines.

2. The semiconductor memory according to claim 1, wherein said capacitor plate is made chiefly of highly doped poly-silicon.

3. The semiconductor memory according to claim 1, wherein the electrode has a third side wall formed substantially vertical to the main surface of the substrate, and wherein the third side wall is surrounded by the first side wall.

4. The semiconductor memory according to claim 1, wherein the first side wall is a side wall of a groove provided in the semiconductor substrate.

5. The semiconductor memory according to claim 1, wherein the second side wall is a side wall of a post provided in a groove provided in the semiconductor substrate.

6. The semiconductor memory according to claim 3, wherein the third side wall is a side wall of a post provided in a groove provided in the semiconductor substrate.

7. The semiconductor memory according to claim 1, wherein the insulating layer includes at least two insulating films comprised of materials selected from a group consisting of $SiO_2$, $Si_3N_4$, $Ta_2O_5$, $TiO_2$ and $Nb_2O_5$.

8. The semiconductor memory according to claim 7, wherein said capacitor plate is made chiefly of highly doped poly-silicon.

9. The semiconductor memory according to claim 4, wherein said capacitor plate is made chiefly of highly doped poly-silicon.

10. The semiconductor memory according to claim 1, wherein the insulating layer includes $Ta_2O_5$.

11. The semiconductor memory according to claim 2, wherein the insulating layer includes $Ta_2O_5$.

* * * * *